(12) United States Patent
Sills et al.

(10) Patent No.: US 12,300,736 B2
(45) Date of Patent: May 13, 2025

(54) TRANSISTORS AND MEMORY ARRAYS

(71) Applicant: Micron Technology, Inc., Boise, ID (US)

(72) Inventors: Scott E. Sills, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/101,120

(22) Filed: Jan. 25, 2023

(65) Prior Publication Data

US 2023/0163189 A1 May 25, 2023

Related U.S. Application Data

(62) Division of application No. 16/940,746, filed on Jul. 28, 2020, now Pat. No. 11,605,723.

(51) Int. Cl.
*H01L 21/00* (2006.01)
*H01L 29/40* (2006.01)
(Continued)

(52) U.S. Cl.
CPC .......... *H01L 29/513* (2013.01); *H01L 29/408* (2013.01); *H01L 29/516* (2013.01);
(Continued)

(58) Field of Classification Search
CPC ... H01L 29/513; H01L 29/408; H01L 29/516; H01L 29/7827; H01L 29/24;
(Continued)

(56) References Cited

U.S. PATENT DOCUMENTS 7,923,723 B2 * 4/2011 Hayashi ............ H01L 21/02631
257/E29.296
8,101,473 B2 * 1/2012 Cho ..................... H01L 29/775
438/164
(Continued)

FOREIGN PATENT DOCUMENTS

JP 2010-177450 8/2010
KR 10-2020-0069472 6/2020
(Continued)

*Primary Examiner* — Richard A Booth
(74) *Attorney, Agent, or Firm* — Wells St. John P.S.

(57) ABSTRACT

Some embodiments include integrated memory having an array of access transistors. Each access transistor includes an active region which has a first source/drain region, a second source/drain region and a channel region. The active regions of the access transistors include semiconductor material having elements selected from Groups 13 and 16 of the periodic table. First conductive structures extend along rows of the array and have gating segments adjacent the channel regions of the access transistors. Heterogenous insulative regions are between the gating segments and the channel regions. Second conductive structures extend along columns of the array, and are electrically coupled with the first source/drain regions. Storage-elements are electrically coupled with the second source/drain regions. Some embodiments include a transistor having a semiconductor oxide channel material. A conductive gate material is adjacent to the channel material. A heterogenous insulative region is between the gate material and the channel material.

22 Claims, 6 Drawing Sheets

(51) Int. Cl.
*H01L 29/51* (2006.01)
*H01L 29/78* (2006.01)
*H10B 12/00* (2023.01)
*H10B 53/10* (2023.01)
*H10B 53/20* (2023.01)
*H10B 53/30* (2023.01)
*H01L 29/24* (2006.01)
*H10B 53/40* (2023.01)

(52) U.S. Cl.
CPC ......... *H01L 29/7827* (2013.01); *H10B 12/31* (2023.02); *H10B 53/10* (2023.02); *H10B 53/20* (2023.02); *H10B 53/30* (2023.02); *H01L 29/24* (2013.01); *H01L 29/517* (2013.01); *H01L 29/518* (2013.01); *H01L 29/78391* (2014.09); *H10B 12/50* (2023.02); *H10B 53/40* (2023.02)

(58) Field of Classification Search
CPC ................ H01L 29/517; H01L 29/518; H01L 29/78391; H10B 53/30; H10B 53/10; H10B 12/31; H10B 53/20; H10B 12/50; H10B 53/40
See application file for complete search history.

(56) References Cited

U.S. PATENT DOCUMENTS

| | | |
|---|---|---|
| 8,551,842 B2 | 10/2013 | Onizawa |
| 2014/0225103 A1 | 8/2014 | Tezuka et al. |
| 2017/0141119 A1* | 5/2017 | Hu .................. H10B 43/27 |
| 2017/0278974 A1 | 9/2017 | Yoshitani et al. |
| 2018/0026639 A1* | 1/2018 | Aurola ................ H01L 29/78 326/81 |
| 2018/0308853 A1* | 10/2018 | Bell ................ H01L 27/0207 |
| 2019/0058043 A1 | 2/2019 | Dewey et al. |
| 2019/0296155 A1 | 9/2019 | Sawabe et al. |
| 2019/0348410 A1 | 11/2019 | Roig-Guitart et al. |
| 2020/0105892 A1 | 4/2020 | Haratipour et al. |
| 2020/0161434 A1 | 5/2020 | Lee et al. |
| 2021/0167212 A1 | 6/2021 | Koezuka et al. |

FOREIGN PATENT DOCUMENTS

| | | |
|---|---|---|
| WO | WO 2017/171739 | 10/2017 |
| WO | WO 2020/026081 | 2/2020 |
| WO | WO PCT/US2021/040518 | 10/2021 |

* cited by examiner

TRANSISTORS AND MEMORY ARRAYS

RELATED PATENT DATA

This patent is a divisional of and claims priority to U.S. patent application Ser. No. 16/940,746, filed Jul. 28, 2020, the disclosures of which are incorporated herein by reference.

TECHNICAL FIELD

Integrated memory (e.g., DRAM, FeRAM, etc.). Transistors having channel material containing at least one element selected from Group 13 of the periodic table and at least one element selected from Group 16 of the periodic table (e.g., transistors comprising channel material containing semiconductor oxide).

BACKGROUND

Memory may utilize memory cells which individually comprise an access transistor in combination with a capacitor. The capacitor may be a ferroelectric capacitor if the memory is ferroelectric random-access memory (FeRAM), or may be a non-ferroelectric capacitor if the memory is traditional dynamic random-access memory (DRAM).

It would be desirable to develop improved transistors and improved memory architecture.

BRIEF DESCRIPTION OF THE DRAWINGS

FIGS. 1A-1C are diagrammatic cross-sectional top-down views of regions comprising example transistors. FIG. 1A is a view along the line A-A of FIG. 1.

DETAILED DESCRIPTION OF THE ILLUSTRATED EMBODIMENTS

Some embodiments include a transistor which has channel material having a semiconductor composition with elements from Groups 13 and 16 of the periodic table (e.g., a semiconductor oxide channel material), and which has a heterogenous insulative region between a gate material and the channel material. Some embodiments include integrated memory having transistors which each comprise a channel material having a semiconductor composition with elements from Groups 13 and 16 of the periodic table (e.g., a semiconductor oxide channel material), and which each comprise a heterogenous insulative region adjacent the channel material. Example embodiments are described with reference to FIGS. 1-7.

Figure 1:
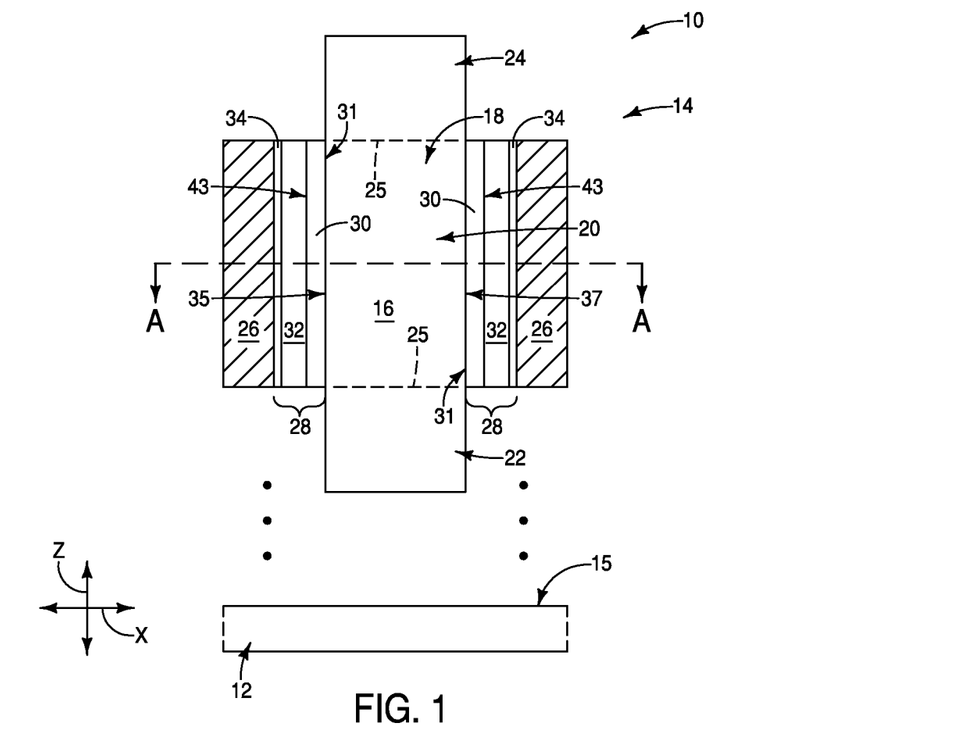
FIG. 1 is a diagrammatic cross-sectional side view of a region comprising an example transistor.

Referring to FIG. 1, a region of an example integrated assembly 10 includes a transistor 14 supported by a base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

The transistor 14 includes a semiconductor material 16 configured as an active region 18. In some embodiments, the semiconductor material 16 may be referred to as active region material.

The semiconductor material 16 may comprise any suitable composition(s); and in some embodiments may comprise, consist essentially of, or consist of at least one metal (e.g., one or more of aluminum, gallium, indium, thallium, tin, cadmium, zinc, etc.) in combination with one or more of oxygen, sulfur, selenium and tellurium. In some embodiments, the semiconductor material 16 may comprise at least one element from Group 13 of the periodic table (e.g., gallium) in combination with at least one element from Group 16 of the periodic table (e.g., oxygen). For instance, the semiconductor material 16 may comprise at least one element selected from the group consisting of gallium, indium and mixtures thereof, in combination with at least one element selected from the group consisting of oxygen, sulfur, selenium, tellurium and mixtures thereof. In some embodiments, the semiconductor material 16 may comprise, consist essentially of, or consist of InGaZnO (where the chemical formula indicates primary constituents rather than a specific stoichiometry).

The active region 18 includes a first source/drain region 22, a second source/drain region 24, and a channel region 20 between the source/drain regions 22 and 24. Dashed-lines 25 are provided to show approximate boundaries between the channel region 20 and the source/drain regions 22, 24. The source/drain regions 22, 24 may be doped with one or more suitable conductivity-enhancing dopants to establish desired conductivity within the source/drain regions, and the channel region 20 may have an appropriate dopant level therein to achieve a desired threshold voltage for the transistor 14.

In the illustrated embodiment, the semiconductor material 16 extends across the channel region 20 and the source/drain regions 22, 24. In other embodiments, the semiconductor material 16 may be within the channel region 20, and the source/drain regions 22, 24 may comprise a different composition than the channel region 20. In such embodiments, the material within the source/drain regions 22, 24 may or may not comprise a composition containing elements from Groups 13 and 16 of the periodic table. In some embodiments, the semiconductor material 16 within the channel region 20 may be referred to as channel material.

In the illustrated embodiment of FIG. 1, the active region 18 is configured as a vertically-extending pillar. Specifically, the base 12 comprises a primary surface 15 which extends along a horizontal direction (x-axis direction), and the active region 18 is elongated along a vertical direction (z-axis direction). The illustrated active region 18 extends substantially orthogonally relative to the primary surface 15 of the base 12 (with the term "substantially orthogonally" meaning orthogonally to within reasonable tolerances of fabrication and measurement). In some embodiments, the active region 18 may extend approximately vertically relative to the primary surface 15 of the base 12, with the vertical direction of the active region 18 being at an angle to the illustrated x-axis direction. In some embodiments, such angle may within a range of from about 75° to about 105°. In some embodiments, the vertical direction of the active region 18 may be referred to as a first direction to distinguish it from the horizontal direction of the primary surface 15 of the base 12.

The primary surface 15 of the base 12 may be understood as being the general surface of the primary material of the base 12, ignoring imperfections, roughness, other materials formed over the base, etc.

The transistor 14 includes conductive gate material 26 adjacent the channel region 20 (i.e., adjacent the channel material 16). The conductive gate material 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive gate material 26 may comprise metal (e.g., one or more of titanium silicide, titanium nitride, titanium, tungsten silicide, tungsten nitride, tungsten, etc.).

The conductive gate material 26 is spaced from the active region 18 by an insulative region 28. The insulative region 28 comprises multiple different compositions, and accordingly may be referred to as a heterogeneous insulative region (to distinguish it from other insulative regions which may comprise only a single material, and accordingly which would be homogeneous insulative regions).

The insulative region 28 of FIG. 1 includes three different insulative compositions 30, 32 and 34. The compositions 30, 32 and 34 may be referred to as a first composition, a second composition and a third composition, respectively. Although the insulative region 28 is shown to comprise three compositions, it is to be understood that in other embodiments the insulative region 28 may comprise more than three compositions or fewer than three compositions.

The second composition 32 may be the bulk of the insulative region 28, and in some embodiments may comprise a horizontal thickness (i.e., a thickness along the x-axis direction) within a range of from about 30 angstroms (Å) to about 100 Å. The second composition 32 may have a very high dielectric constant; and in some embodiments may have a dielectric constant at least as high as that of aluminum oxide (i.e., at least about 9.1).

The second composition 32 may comprise any suitable substance(s); and in some embodiments may include one or more of hafnium, niobium and zirconium in combination with one or more of carbon, oxygen, nitrogen and silicon. In some embodiments, the second composition 32 may comprise one or more of AlO, HfO, ZrO, HfSiO, ZrSiO, SiOC, SiON, etc., where the chemical formulas indicate primary constituents rather than specific stoichiometries. In some embodiments, the second composition 32 may comprise, consist essentially of, or consist of oxygen in combination with one or more transition metals (where the term "transition metal" refers to elements within Groups 3-12 of the periodic table, as well as to the elements within the actinide and lanthanide series).

In operation, the gate material 26 may be considered to be operatively adjacent to (operatively proximate to) the channel region 20 such that a sufficient voltage applied to the gate material 26 will induce an electric field which enables current flow through the channel region 20 to electrically couple the source/drain regions 22 and 24 with one another. If the voltage to the gate material 26 is below a threshold level, the current will not flow through the channel region 20, and the source/drain regions 22 and 24 will not be electrically coupled with one another. The selective control of the coupling/decoupling of the source/drain regions through the level of voltage applied to the gate material 26 may be referred to as gated coupling of the source/drain regions 22 and 24. The high-k composition 32 may advantageously enable appropriate coupling to be achieved between the gate material 26 and the channel material 20 to rapidly turn-on/turn-off the desired electrical field so that the transistor 14 may be rapidly and effectively switched between an ON configuration (in which the source/drain regions 22 and 24 are coupled to one another through the channel region) and an OFF configuration (in which the source/drain regions 22 and 24 are not coupled to one another through the channel region).

The high-k (high dielectric constant) properties of the second composition 32 may be the primary properties of the insulative regions 28. The other compositions 30 and 34 may be provided to enable the high-k composition 32 to be suitably incorporated into the insulative region 28. The dielectric constant of the second composition 32 may be higher than the dielectric constants of the first and third compositions 30 and 34.

The first composition 30 is directly against the semiconductor material 16, and is provided along an interface 31 where the insulative region 28 joins to the semiconductor material 16. The first composition 30 may establish desired properties along the interface 31. For instance, the first composition 30 may reduce a density of interfacial traps (e.g., dangling bonds) to less than or equal to about $1\times10^8$ traps/cm$^2$, which may alleviate instability in a threshold voltage. As another example, the first composition 30 may retain a concentration of fixed charge to a relatively high level (e.g., greater than or equal to about $1\times10^{12}$ atoms/cm$^3$). The fixed charge may be negative or positive. In some embodiments it may be advantageous for the fixed charge to be negative as such will assist in accumulating charge along the interface 31. The accumulated charge may lower the effective threshold voltage of the transistor device 14, which may improve operational characteristics of the transistor device (e.g., reduce power required to operate the transistor device, and/or improve speed of operation of the transistor device). In some embodiments the first composition 30 may be configured to improve adhesion of the insulative region 28 to the semiconductor material 16.

The first composition 30 may comprise any suitable substance(s). In some embodiments, the composition 30 may comprise only non-ferroelectric material (e.g., may be a non-ferroelectric insulative material). The non-ferroelectric insulative material may, for example, comprise, consist essentially of, or consist of silicon dioxide, aluminum oxide, etc. In some embodiments, the composition 30 may comprise ferroelectric material (e.g., may be a ferroelectric insulative material). The ferroelectric insulative material may comprise any suitable composition or combination of compositions; and in some embodiments may include one or more of transition metal oxide, zirconium, zirconium oxide, niobium, niobium oxide, hafnium, hafnium oxide, lead zirconium titanate, and barium strontium titanate. Also, in some embodiments the ferroelectric insulative material may have dopant therein which comprises one or more of silicon, aluminum, lanthanum, yttrium, erbium, calcium, magnesium, strontium, and a rare-earth element.

Non-ferroelectric insulative material may be desired for the first composition 30 if dipoles associated with the ferroelectric material are problematic. Alternatively, ferroelectric insulative material may be desired for the first composition 30 in embodiments in which the dipoles associated with the ferroelectric material are found to be advantageous (e.g., such dipoles may be utilized for dipole-engineering in some applications).

The first composition 30 may be formed to any suitable thickness. In some applications, the first composition may be discontinuous, and in other applications the first composition 30 may be continuous. If the first composition 30 is continuous, such may have a thickness within a range of from about one monolayer to about 30 Å, and in some embodiments may have a thickness within a range of from about 5 Å to about 20 Å. In some embodiments, the first composition 30 may comprise aluminum and oxygen (e.g., aluminum oxide), and may have the thickness within the range of from about 5 Å to about 20 Å.

The third composition 34 may be provided to alleviate or prevent Fermi-level pinning between the second composition 32 and the gate material 26. Fermi-level pinning may occur when material having a very high dielectric constant is placed directly against a metal-containing material. The third composition 34 may be utilized as an intervening material to separate the high-dielectric-constant material 32 from the metal-containing material 26.

The third composition 34 may comprise any suitable substance(s). In some embodiments, the third composition may comprise oxygen in combination with one or more of silicon, nitrogen, carbon and aluminum. In some embodiments, the third composition may comprise, consist essentially of, or consist of one or more of doped silicate glass (e.g., phosphosilicate glass, fluorosilicate glass, borophosphosilicate glass, etc.), SiO, AlO, AlSiO, SiOC and SiON, where the chemical formulas indicate primary constituents rather than specific stoichiometries. In some embodiments, the third composition may have a dielectric constant less than that of silicon dioxide (i.e., less than about 3.9). For instance, the third composition may comprise carbon-doped silicon dioxide, boron-doped silicon oxide, porous silicon dioxide, etc.

The third composition 34 may be formed to any suitable thickness. In some embodiments, the third composition may be discontinuous. In some embodiments, the third composition 34 may be continuous, and may have a thickness within a range of from about one monolayer to about 30 Å. In some embodiments, the third composition may have a thickness within a range of from about 5 Å to about 20 Å.

The first, second and third compositions (30, 32, 34) may have any suitable relative thicknesses. In some embodiments, the first, second and third compositions (30, 32, 34) may have about the same thickness as one another (with the term "about the same" meaning the same to within reasonable tolerances of fabrication and measurement). In other embodiments, at least one of the first, second and third compositions (30, 32, 34) may have a different thicknesses relative to at least one other of such compositions.

Figure 1A:
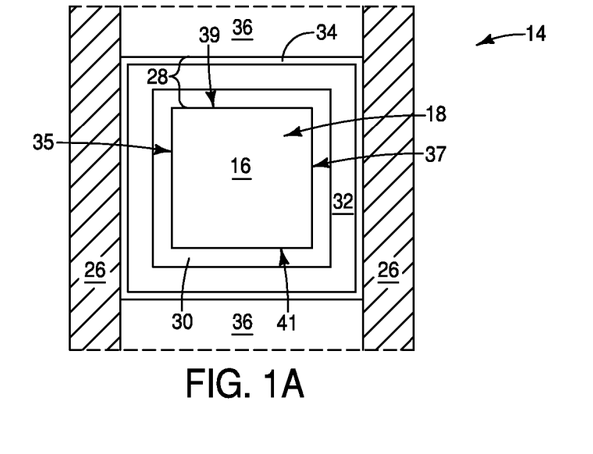

The gate material 26 is adjacent to opposing sides 35 and 37 of the active region 18 along the cross-sectional view of FIG. 1. FIG. 1A shows a top-down cross-section along the line A-A of FIG. 1. The top-down view shows that the active region 18 comprises four sides 35, 37, 39 and 41, and shows that the gate material 26 is along only the two sides 35 and 37 in the illustrated embodiment. The shown active region 18 is square-shaped in the top-down view. In other embodiments, the active region 18 may have other shapes in top-down view, including, for example, a circular shape, an elliptical shape, a rectangular shape, other polygonal shapes, etc.

The illustrated embodiment of FIG. 1A has the insulative region 28 entirely laterally surrounding the active region 18 (i.e., the channel material 16). In other embodiments, the insulative region 28 may be provided only along the sides 35 and 37 of the active region 18 (i.e., only along the sides which are adjacent the conductive gate material 26), rather than entirely surrounding the active region 18.

An insulative material 36 is adjacent to the insulative region 28 along portions of the insulative region 28 which are not covered by the conductive gate material 26. The insulative material 36 may comprise any suitable composition(s); and in some embodiments may comprise, consist essentially of, or consist of silicon dioxide.

Figure 1B:
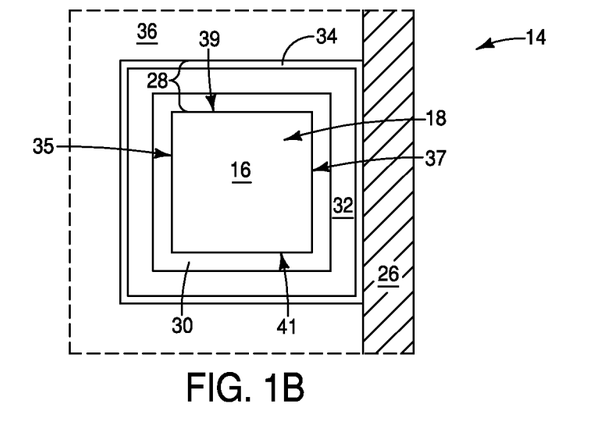

FIG. 1B shows a top-down view of another configuration of the transistor 14. The conductive gate material 26 is only along the one side 37 of the active region 18, and is not along the other sides (35, 39, 41) of the active region.

Figure 1C:
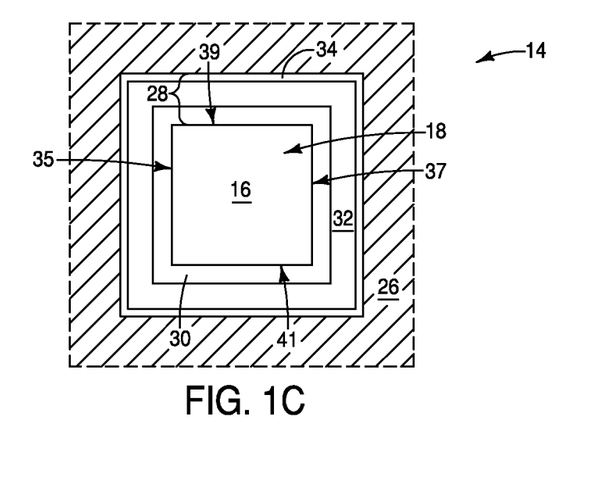

FIG. 1C shows a top-down view of another configuration of the transistor 14. The conductive gate material 26 laterally surrounds the active region 18, and specifically is along all four of the sides 35, 37, 39 and 41 of the active region. In some embodiments, the channel material 16 of FIG. 1 may be considered to have a central region corresponding to the channel region 20. The central region has a pair of opposing ends which are defined by the dashed-lines 25 bounding the upper and lower edges of the channel region 20. The gate material 26 of FIG. 1C may be considered to entirely surround a lateral periphery of the central region of the channel material 16.

Figure 2:
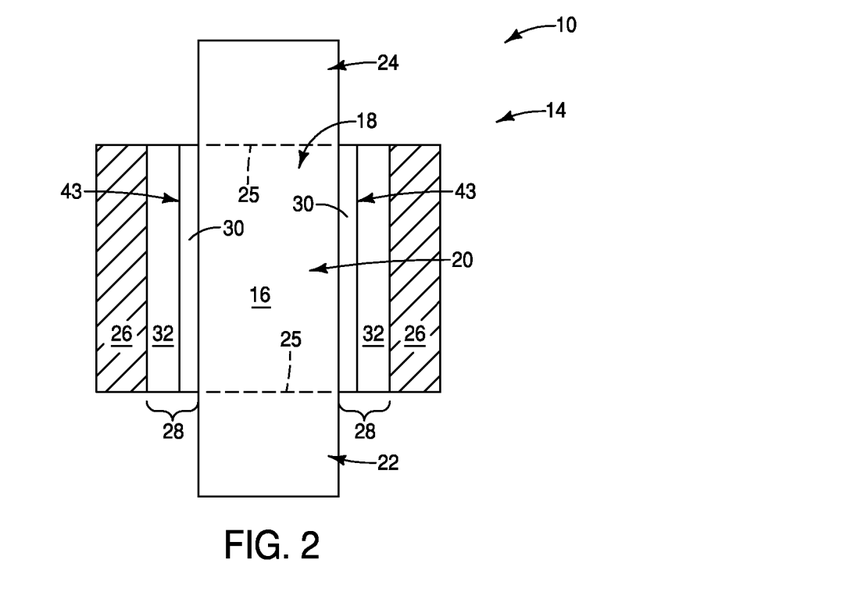
FIGS. 2 and 3 are diagrammatic cross-sectional side views of regions comprising example transistors.

As discussed above, the high-k composition 32 may be the primary composition of the insulative region 28. In some embodiments, another of the compositions of the insulative region 28 may be omitted if it is found that such other of the compositions is not necessary. For instance, if Fermi-level pinning is found to be nonproblematic, it may be desirable to omit the third composition 34 (FIG. 1). FIG. 2 shows the transistor 14 in a configuration in which the third composition 34 is omitted, and accordingly in which the heterogeneous insulative region 28 only comprises the two compositions 30 and 32.

Figure 3:
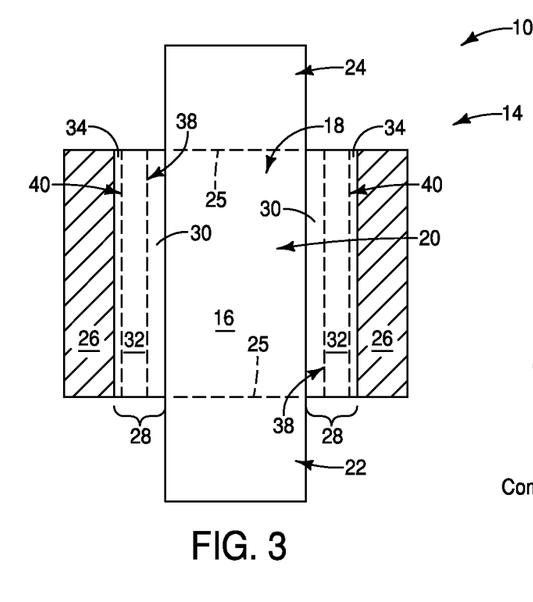

The embodiments of FIGS. 1 and 2 show the compositions 30, 32 and 34 having abrupt interfaces where the different compositions join to one another. For instance, there is an abrupt interface 43 between the compositions 30 and 32. The term "abrupt interface" means that there is little, if any, mixing of the adjacent compositions (e.g., 30 and 32) across the interface (e.g., 43). In some embodiments, the interface between the adjacent compositions may be replaced with an interfacial region which includes a gradient transitioning from one of the compositions to the other of the compositions. FIG. 3 shows the transistor 14 in an alternative configuration relative to that of FIG. 1. The configuration of FIG. 3 has a first interfacial region 38 between the compositions 30 and 32, and has a second interfacial region 40 between the compositions 32 and 34. The interfacial regions 38 and 40 are diagrammatically illustrated with dashed lines to indicate that they comprise gradients rather than being abrupt transitions.

Figure 3A:
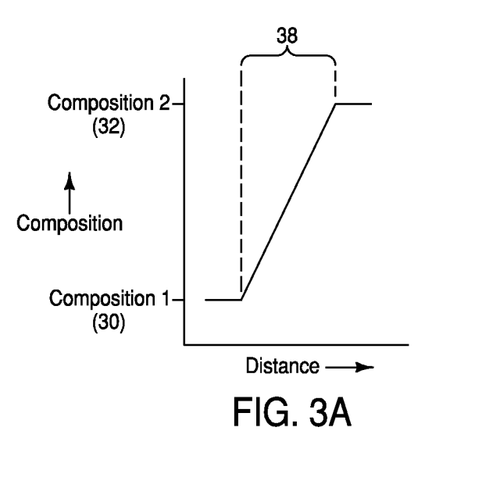
FIG. 3A is a graphical view of composition versus distance across an example interface of an example structure.

FIG. 3A graphically illustrates a gradient transition from a first composition (Composition 1, which is the composition 30 in the illustrated embodiment) to a second composition (Composition 2, which is the composition 32 in the illustrated embodiment), with such gradient transition occurring across the interfacial region 38. A similar gradient transition may extend across the interfacial region 40.

Figure 4:
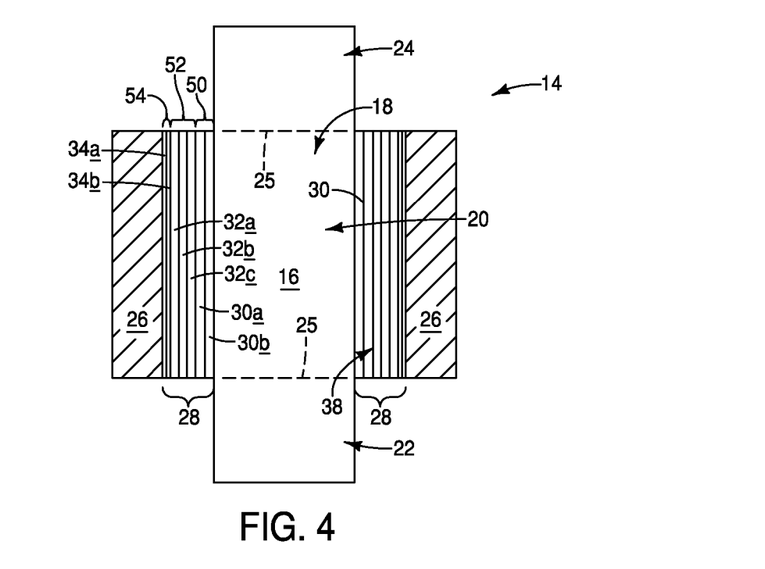
FIGS. 4 and 5 are diagrammatic cross-sectional side views of regions comprising example transistors.

In some embodiments, one or more of the illustrated compositions 30, 32 and 34 of FIG. 1 may be replaced with a laminate configuration, rather than comprising only a single homogeneous material. FIG. 4 shows the transistor 14 in a configuration in which the composition 30 is replaced with a first insulative structure 50 corresponding to a laminate comprising two different laminate layers (laminate materials) 30a and 30b; the composition 32 is replaced with a second insulative structure 52 corresponding to a laminate comprising three different laminate layers (laminate materials) 32a, 32b and 32c; and the composition 34 is replaced with a third insulative structure 54 corresponding to a laminate comprising two different laminate layers (laminate materials) 34a and 34b. The layers 30a and 30b may comprise any of the compositions described above as being suitable for the composition 30. Similarly, the layers 32a-c may comprise any of the compositions described above as being suitable for the composition 32, and the layers 34a and 34b may comprise any of the compositions described above as being suitable for the composition 34. The insulative structures 50, 52 and 54 may comprise any suitable number of individual laminate layers. The interfaces between the laminate layers may be abrupt interfaces or gradients.

Figure 5:
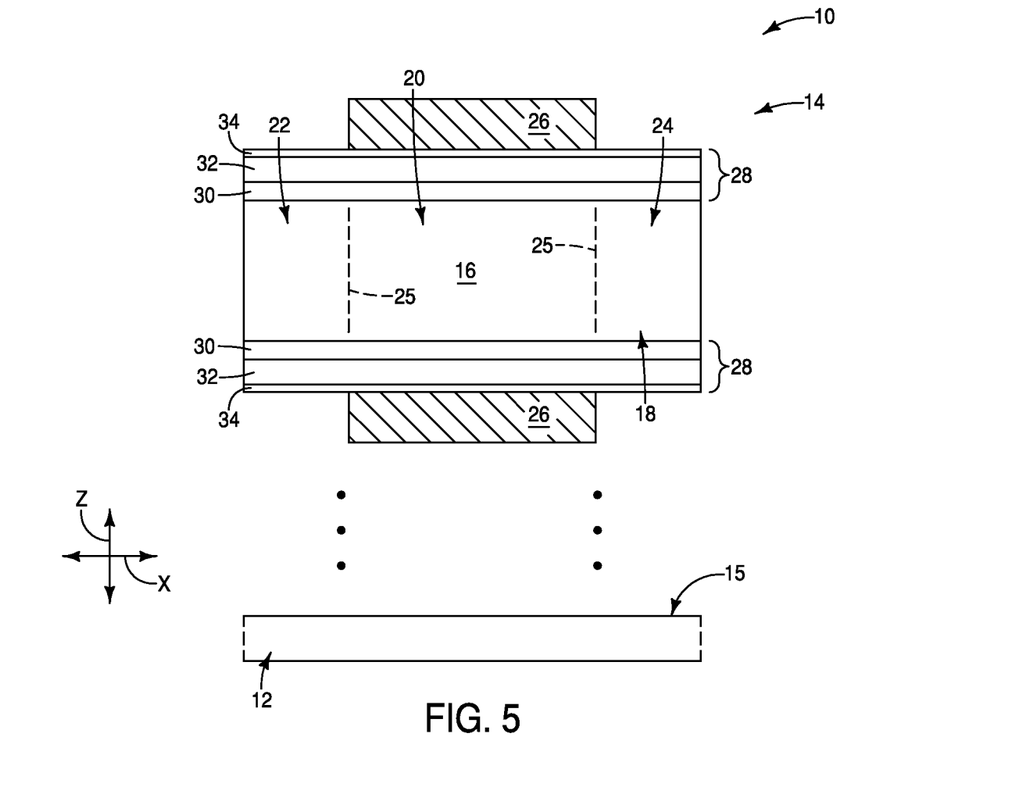

The transistor 14 of FIG. 1 has the active region 18 extending vertically. In other embodiments the active region 18 may extend horizontally, or along any other suitable direction. FIG. 5 shows an assembly 10 comprising a transistor 14 similar to the transistor 14 of FIG. 1, but oriented such that the semiconductor material 16 extends horizontally (i.e., along the illustrated x-axis), and accordingly extends parallel to the primary surface 15 of the base 12.

Figure 6:
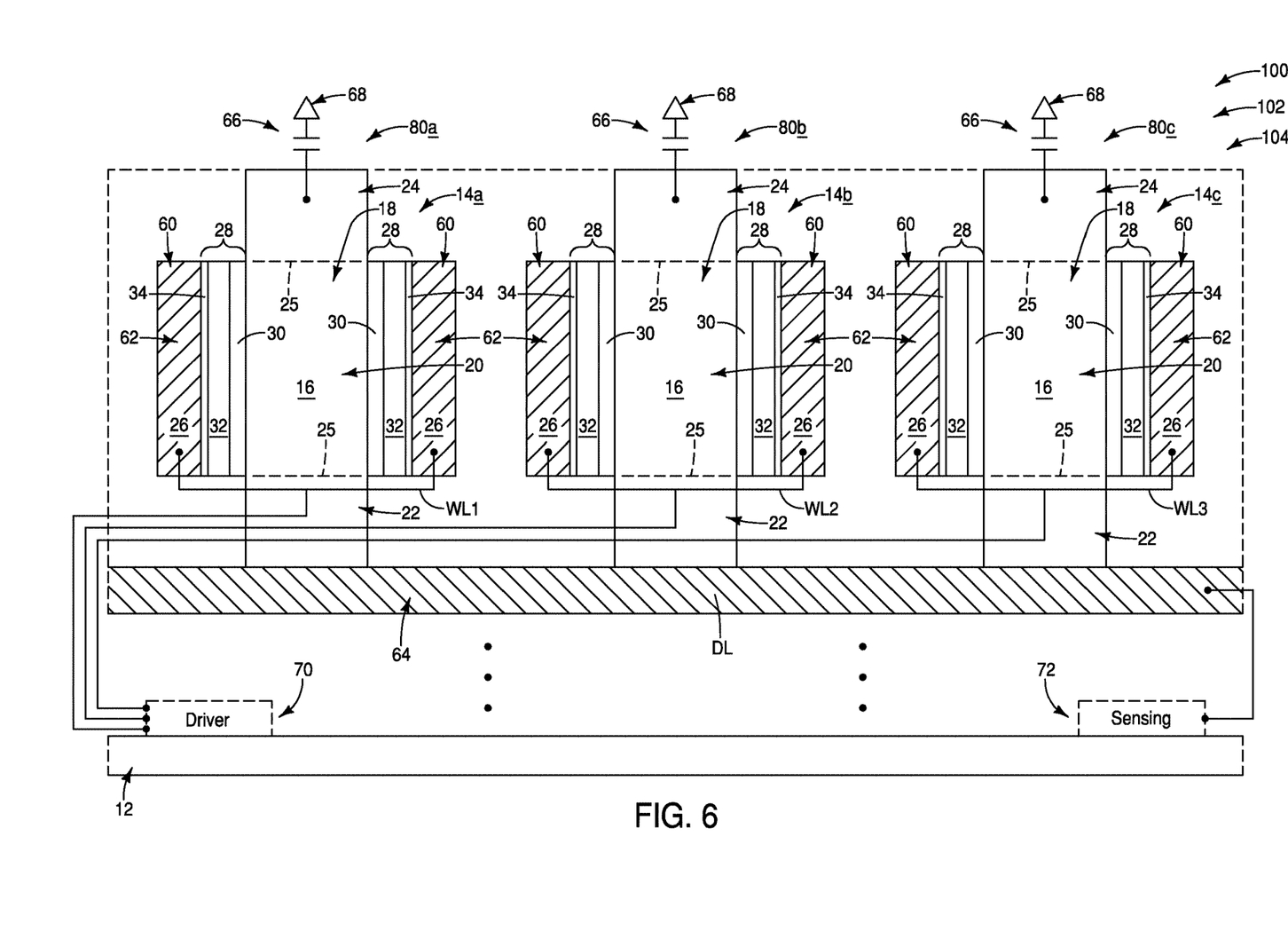
FIG. 6 is a diagrammatic cross-sectional side view of a region comprising an example portion of an example memory array.

In some embodiments, the transistors described above may be utilized as access transistors (access devices, switching devices) within integrated memory. FIG. 6 shows a region of an integrated assembly 100 comprising integrated memory 102.

The assembly 100 includes a plurality of the access transistors 14, with the illustrated transistors being labeled 14a, 14b, and 14c. The illustrated transistors are identical to the transistor described above with reference to FIG. 1. In other embodiments, the transistors 14a-c may comprise any of the other configurations described herein.

Each of the access transistors 14a-c comprises an active region 18 which includes a first source/drain region 22, a second source/drain region 24, and a channel region 20 between the first and second source/drain regions. Also, each of the access transistors 14a-c includes a heterogeneous insulative region 28.

The access transistors 14a-c may be part of a memory array 104. The array 104 may be considered to comprise rows which extend in and out of the page relative to the cross-section of FIG. 6, and to comprise columns which extend along the page of the cross-section of FIG. 6.

The gate material 26 may be considered to be along first conductive structures 60 which extend along the rows of the array 104. The first conductive structures correspond to wordlines WL1, WL2 and WL3. The wordlines are shown to be electrically coupled with driver circuitry (e.g., WORDLINE DRIVER circuitry) 70 supported by the base 12.

The wordlines have gating segments 62 along the channel regions 20 of the access transistors 14a-c. The gating segments 62 are operatively proximate the channel regions, and are configured for gatedly coupling the source/drain regions 22 and 24 to one another during operation of the access devices. The gating segments 62 are spaced from the channel regions 20 by the heterogeneous insulative regions 28.

A second conductive structure 64 extends along a column of the array 104. The second conductive structure is electrically coupled with the first source/drain regions 22 of the access devices 14a-c. The second conductive structure corresponds to a digit line (DL) and is electrically coupled with sensing circuitry 72 (e.g., SENSE AMPLIFIER circuitry) supported by the base 12.

Storage-elements 66 are electrically coupled with the second source/drain regions 24. The storage-elements may be any suitable devices having at least two detectable states; and in some embodiments may be, for example, capacitors (as shown), resistive-memory devices, conductive-bridging devices, phase-change-memory (PCM) devices, programmable metallization cells (PMCs), etc. The illustrated capacitors have first electrodes coupled with the source/drain regions 24, and have second electrodes coupled with a reference voltage 68. The reference voltage may be any suitable voltage, and some embodiments may be common plate (CP) voltage. The common plate voltage may be, for example, ground, VCC/2, etc.

The capacitors of the storage-elements 66 may be non-ferroelectric capacitors in some embodiments (e.g., may comprise non-ferroelectric insulative material between the first and second electrodes), and may be ferroelectric capacitors (e.g., may comprise ferroelectric insulative material between the first and second electrodes) in other embodiments.

The access transistors 14a-c, together with the storage-elements 66, form a plurality of memory cells 80a-c of the memory array 104. The memory array may be a DRAM array if the capacitors 66 comprise non-ferroelectric insulative material, and may be an FeRAM array if the capacitors comprise ferroelectric insulative material.

In the illustrated embodiment of FIG. 6, the driver circuitry 70 and the sensing circuitry 72 are directly under the memory cells 80a-c of the memory array 104. In some embodiments, the circuitries 70 and 72 may be considered to be examples of logic circuitry (e.g., CMOS) which may be provided directly under the memory array. In some embodiments, at least some of the logic circuitry may be provided in other locations, such as, for example, above the memory array, laterally outward of the memory array, etc.

Figure 7:
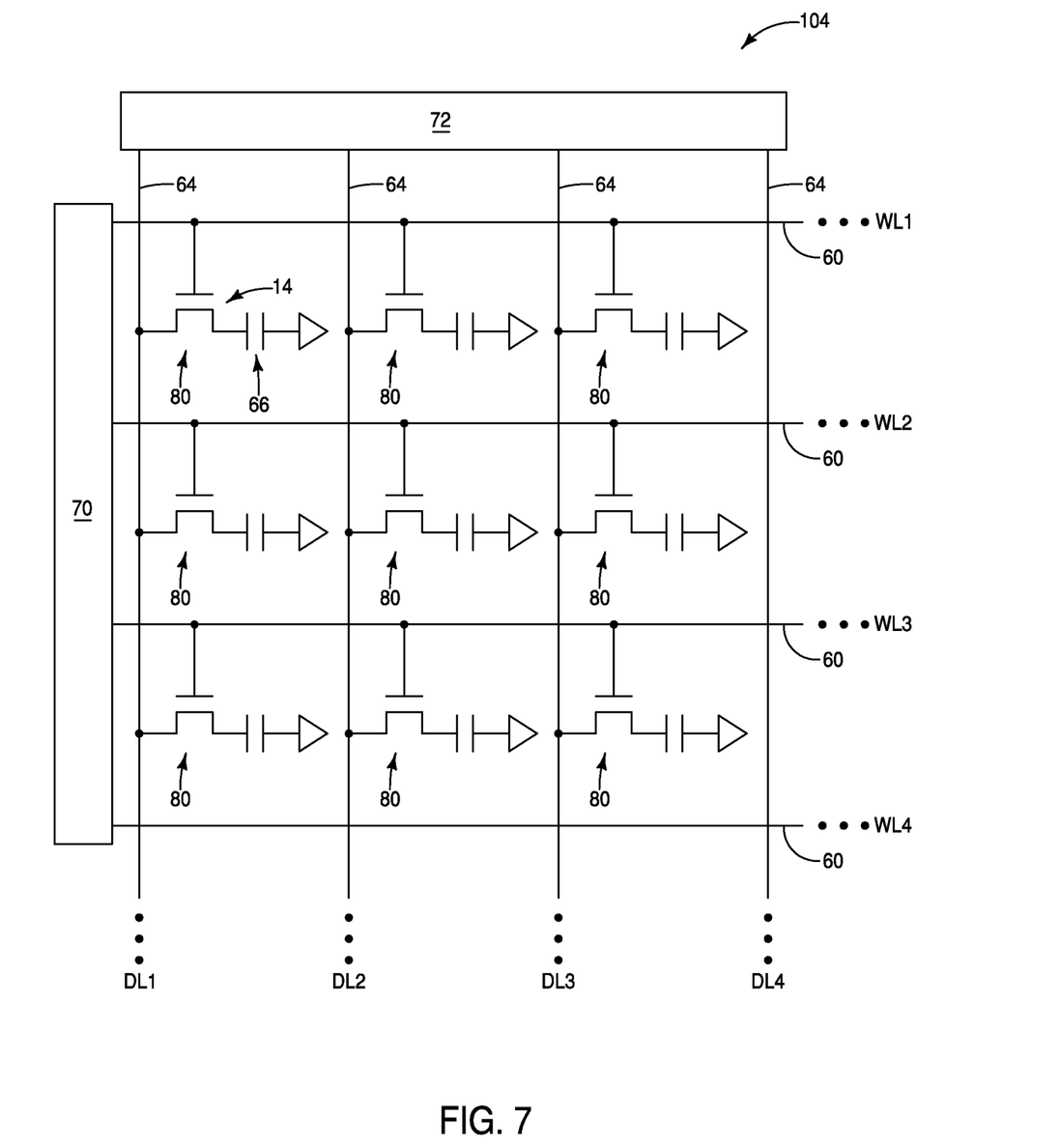
FIG. 7 is a diagrammatic schematic view of a region of an example memory array.

The array 104 may comprise any suitable configuration. FIG. 7 shows an example configuration for a DRAM array. Such configuration has digit lines 64 (DL1-DL4) coupled with the sensing circuitry 72 and extending along columns of the array, and has wordlines 60 (WL1-WL4) coupled with the driver circuitry 70 and extending along rows of the array. Each of the memory cells 80 is uniquely addressed by one of the digit lines in combination with one of the wordlines. The memory cells 80 include the access transistors 14 and the capacitors 66.

The illustrated memory array 104 of FIG. 7 is a DRAM array. In other embodiments, the memory array 104 may be an FeRAM array.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a transistor having a semiconductor oxide channel material. A conductive gate material is adjacent the channel material. A heterogenous insulative region is between the gate material and the channel material.

Some embodiments include an integrated assembly having a channel material which includes at least one element selected from the group consisting of gallium, indium and mixtures thereof, in combination with at least one element selected from the group consisting of oxygen, sulfur, selenium, tellurium and mixtures thereof. A first insulative composition is directly adjacent the channel material. A second insulative composition is adjacent the first insulative composition and has a higher dielectric constant than the first insulative composition. A conductive gate material is spaced from the first insulative composition by at least the second insulative composition.

Some embodiments include an integrated assembly having a channel material comprising semiconductor material which includes at least one element selected from Group 13 of the periodic table in combination with at least one element selected from Group 16 of the periodic table. A first insulative structure has a region directly adjacent the channel material. A second insulative structure is adjacent the first insulative structure and has a higher dielectric constant than the first insulative structure. A conductive gate material is adjacent the second insulative structure.

Some embodiments include integrated memory having an array of access transistors. Each of the access transistors includes an active region which has a first source/drain region, a second source/drain region and a channel region between the first and second source/drain regions. The array includes rows and columns. The active regions of the access transistors include semiconductor material which has at least one element selected from Group 13 of the periodic table in combination with at least one element selected from Group 16 of the periodic table. The semiconductor material is within at least the channel regions. First conductive structures extend along the rows of the array and have gating segments adjacent the channel regions of the access transistors. Heterogenous insulative regions are between the gating segments and the channel regions. Second conductive structures extend along the columns of the array. The second conductive structures are electrically coupled with the first source/drain regions. Storage-elements are electrically coupled with the second source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A transistor comprising semiconductor oxide channel material, conductive gate material adjacent the channel material, and a heterogenous insulative region between the gate material and the channel material;
    wherein the heterogeneous insulative region includes an interfacial region between first and second insulative compositions, with said interfacial region including a gradient transitioning from the first insulative composition to the second insulative composition, a thickness of the gradient transitioning is greater than a thickness of the first insulative composition; and
    wherein the first insulative composition comprises one or more of transition metal oxide, zirconium, zirconium oxide, niobium, niobium oxide, hafnium, hafnium oxide, lead zirconium titanate, and barium strontium titanate.

2. A transistor comprising semiconductor oxide channel material, conductive gate material adjacent the channel material, and a heterogenous insulative region between the gate material and the channel material;
   wherein the heterogeneous insulative region includes a second composition sandwiched between a first composition and a third composition; wherein the first composition is directly against the channel material and the third composition is directly against the gate material; and wherein the second composition has a higher dielectric constant than the first and third compositions; and
   wherein the first composition is ferroelectric.

3. A transistor comprising semiconductor oxide channel material, conductive gate material adjacent the channel material, and a heterogenous insulative region between the gate material and the channel material;
   wherein the heterogeneous insulative region includes a second composition sandwiched between a first composition and a third composition; wherein the first composition is directly against the channel material and the third composition is directly against the gate material; and wherein the second composition has a higher dielectric constant than the first and third compositions;
   wherein all three of the first, second and third compositions are of different thicknesses relative to one another; and
   wherein the first insulative composition comprises one or more of transition metal oxide, zirconium, zirconium oxide, niobium, niobium oxide, hafnium, hafnium oxide, lead zirconium titanate, and barium strontium titanate.

4. A transistor comprising semiconductor oxide channel material, conductive gate material adjacent the channel material, and a heterogenous insulative region between the gate material and the channel material;
   wherein the heterogeneous insulative region includes a second composition sandwiched between a first composition and a third composition; wherein the first composition is directly against the channel material and the third composition is directly against the gate material; and wherein the second composition has a higher dielectric constant than the first and third compositions; and
   wherein the first composition is continuous and comprising a thickness within a range of from about a monolayer to 30 angstroms.

5. A transistor comprising semiconductor oxide channel material, conductive gate material adjacent the channel material, and a heterogenous insulative region between the gate material and the channel material;
   wherein the heterogeneous insulative region includes a second composition sandwiched between a first composition and a third composition; wherein the first composition is directly against the channel material and the third composition is directly against the gate material; and wherein the second composition has a higher dielectric constant than the first and third compositions; and
   wherein the third composition is continuous and comprising a dielectric constant less than that of silicon dioxide.

6. An integrated assembly comprising:
   a channel material comprising semiconductor material which includes at least one element selected from the group consisting of gallium, indium and mixtures thereof, in combination with at least one element selected from the group consisting of oxygen, sulfur, selenium, tellurium and mixtures thereof;
   a first insulative composition directly adjacent the channel material;
   a second insulative composition adjacent the first insulative composition and having a higher dielectric constant than the first insulative composition;
   a conductive gate material spaced from the first insulative composition by at least the second insulative composition; and
   wherein the gate material is along two opposing sides of the channel material and along a different set of two opposing sides of the channel material, and the gate material is not over a top portion of the channel material.

7. An integrated assembly comprising:
   a channel material comprising semiconductor material which includes at least one element selected from the group consisting of gallium, indium and mixtures thereof, in combination with at least one element selected from the group consisting of oxygen, sulfur, selenium, tellurium and mixtures thereof;
   a first insulative composition directly adjacent the channel material;
   a second insulative composition adjacent the first insulative composition and having a higher dielectric constant than the first insulative composition;
   a conductive gate material spaced from the first insulative composition by at least the second insulative composition;
   wherein the channel material is supported by an underlying semiconductor base; wherein the channel material is elongated along a first direction; and wherein the first direction is substantially parallel to a primary surface of the semiconductor base;
   wordline driver circuitry supported upon the semiconductor base; and
   a digit line between the semiconductor base and the channel material.

8. An integrated assembly comprising:
   a channel material comprising semiconductor material which includes at least one element selected from Group 13 of the periodic table in combination with at least one element selected from Group 16 of the periodic table;
   a first insulative structure having a region directly adjacent the channel material;
   a second insulative structure adjacent the first insulative structure and having a higher dielectric constant than the first insulative structure;
   a conductive gate material adjacent the second insulative structure; and
   wherein the first insulative structure comprises two or more different materials comprising one or more of: niobium, niobium oxide, hafnium, hafnium oxide, lead zirconium titanate, and barium strontium titanate, aluminum, lanthanum, yttrium, erbium, calcium, magnesium, strontium, and a rare-earth element.

9. An integrated assembly comprising:
   a channel material comprising semiconductor material which includes at least one element selected from Group 13 of the periodic table in combination with at least one element selected from Group 16 of the periodic table;
   a first insulative structure having a region directly adjacent the channel material;

a second insulative structure adjacent the first insulative structure and having a higher dielectric constant than the first insulative structure;

a conductive gate material adjacent the second insulative structure; and wherein the second insulative structure comprises two or more different materials, the second insulative structure comprising a dielectric constant of about 9.1.

10. The transistor of claim 1 wherein the thickness of the gradient transitioning is greater than a thickness of the second insulative composition.

11. The transistor of claim 2 wherein the ferroelectric comprises insulative material.

12. The transistor of claim 2 wherein the ferroelectric comprises one or more of transition metal oxide, zirconium, zirconium oxide, niobium, niobium oxide, hafnium, hafnium oxide, lead zirconium titanate, and barium strontium titanate.

13. The transistor of claim 2 wherein the ferroelectric comprises a dopant of one or more of silicon, aluminum, lanthanum, yttrium, erbium, calcium, magnesium, strontium, and a rare-earth element.

14. The transistor of claim 3 wherein the second composition has a greater thickness than the first composition.

15. The transistor of claim 14 wherein the second composition has a greater thickness than the third composition.

16. The transistor of claim 4 wherein the first composition comprises one or more of transition metal oxide, zirconium, zirconium oxide, niobium, niobium oxide, hafnium, hafnium oxide, lead zirconium titanate, and barium strontium titanate.

17. The transistor of claim 4 wherein the first composition comprises a dopant of one or more of silicon, aluminum, lanthanum, yttrium, erbium, calcium, magnesium, strontium, and a rare-earth element.

18. The integrated assembly of claim 7 further comprising sense amplifier circuitry supported upon the semiconductor base.

19. The transistor of claim 1 wherein the first insulative composition comprises a dopant of one or more of silicon, aluminum, lanthanum, yttrium, erbium, calcium, magnesium, strontium, and a rare-earth element.

20. The transistor of claim 3 wherein the first insulative composition comprises a dopant of one or more of silicon, aluminum, lanthanum, yttrium, erbium, calcium, magnesium, strontium, and a rare-earth element.

21. A transistor comprising semiconductor oxide channel material, conductive gate material adjacent the channel material, and a heterogenous insulative region between the gate material and the channel material;

wherein the heterogeneous insulative region includes an interfacial region between first and second insulative compositions, with said interfacial region including a gradient transitioning from the first insulative composition to the second insulative composition, a thickness of the gradient transitioning is greater than a thickness of the first insulative composition; and wherein the first insulative composition comprises a dopant of one or more of silicon, aluminum, lanthanum, yttrium, erbium, calcium, magnesium, strontium, and a rare-earth element.

22. A transistor comprising semiconductor oxide channel material, conductive gate material adjacent the channel material, and a heterogenous insulative region between the gate material and the channel material;

wherein the heterogeneous insulative region includes a second composition sandwiched between a first composition and a third composition; wherein the first composition is directly against the channel material and the third composition is directly against the gate material; and wherein the second composition has a higher dielectric constant than the first and third compositions; wherein all three of the first, second and third compositions are of different thicknesses relative to one another; and wherein the first insulative composition comprises a dopant of one or more of silicon, aluminum, lanthanum, yttrium, erbium, calcium, magnesium, strontium, and a rare-earth element.

* * * * *